(12) United States Patent
Asano et al.

(10) Patent No.: US 12,231,130 B2
(45) Date of Patent: Feb. 18, 2025

(54) LOW POWER COMPARATOR

(71) Applicant: Renesas Design (UK) Limited, Bourne End (GB)

(72) Inventors: Hiroki Asano, Kanagawa (JP); Kenji Tomiyoshi, Chiba (JP)

(73) Assignee: Renesas Design (UK) Limited, Bourne End (GB)

( * ) Notice: Subject to any disclaimer, the term of this patent is extended or adjusted under 35 U.S.C. 154(b) by 0 days.

(21) Appl. No.: 18/147,100

(22) Filed: Dec. 28, 2022

(65) Prior Publication Data

US 2024/0223174 A1 Jul. 4, 2024

(51) Int. Cl.
  G01R 19/165 (2006.01)
  G06F 1/28 (2006.01)
  H03F 3/45 (2006.01)
  H03K 5/24 (2006.01)

(52) U.S. Cl.
  CPC ..... H03K 5/2481 (2013.01); G01R 19/16566 (2013.01); G06F 1/28 (2013.01); H03F 3/45071 (2013.01)

(58) Field of Classification Search
  CPC .. H03K 3/011; H03K 3/02337; H03K 3/0337; H03K 3/13; H03K 3/2893; H03K 3/3565; H03K 5/22; H03K 5/24; H03K 5/2472; H03K 5/2481; H03F 3/45071; G06F 1/24; G06F 1/28; G01R 19/165; G01R 19/16566; G01R 19/16571; G01R 19/16576; G01R 19/1659
  See application file for complete search history.

(56) References Cited

U.S. PATENT DOCUMENTS

| 4,446,381 A * | 5/1984 | Dalrymple ....... H03K 3/356008 327/143 |
| 6,429,705 B1 * | 8/2002 | Bando .................. H03K 17/145 327/143 |
| 7,109,761 B2 * | 9/2006 | Isomura ............. H03K 3/02337 327/321 |
| 9,590,504 B2 | 3/2017 | Al-Shyoukh et al. |

(Continued)

OTHER PUBLICATIONS

"CMOS Analog Circuit Design", Chapter 8 (19 pages), Philip E. Allan et al., Oxford University Press, 2011.

(Continued)

Primary Examiner — Long Nguyen
(74) Attorney, Agent, or Firm — SCULLY, SCOTT, MURPHY & PRESSER, P.C.

(57) ABSTRACT

A comparator is presented. The comparator includes an input port for receiving an input voltage; an output port for providing an output voltage; a resistive divider, first and second transistors, and a differential amplifier. The resistive divider has a first node for providing a first voltage and a second node for providing a second voltage. The first transistor has a control terminal coupled to the first node, a first terminal coupled to the input port, and a second terminal coupled to a common node. The second transistor has a control terminal coupled to the second node, a first terminal coupled to the input port, and a second terminal coupled to the common node. The differential amplifier has a first input coupled to the first terminal of the first transistor, a second input coupled to the first terminal of the second transistor and an output coupled to the output port.

16 Claims, 17 Drawing Sheets

(56) References Cited

U.S. PATENT DOCUMENTS

| | | |
|---|---|---|
| 10,585,447 B1 | 3/2020 | Tanimoto |
| 2010/0073032 A1* | 3/2010 | Abe .................... H03K 3/3565 327/50 |
| 2015/0234412 A1 | 8/2015 | Al-Shyoukh et al. |
| 2015/0234413 A1 | 8/2015 | Al-Shyoukh et al. |
| 2019/0064867 A1 | 2/2019 | Al-Shyoukh et al. |

OTHER PUBLICATIONS

M. Al-Shyoukh and A. Kalnitsky, "A 500nA quiescent current, trim-free, +1.75% absolute accuracy, CMOS-only voltage reference based on anti-doped N-channel MOSFETs," Proceedings of the IEEE 2014 Custom Integrated Circuits Conference, San Jose, CA, USA, 2014, pp. 1-4.

\* cited by examiner

| Process | | TSMC 130-nm CMOS BCD |
|---|---|---|
| Iq ($V_{IN}$ = 5 V) | Typical @ RT | 2.44 uA |
| | Process & temp. | 1.53 uA < Iq < 4.93 uA |
| Absolute value ($V_{Rise}$) | Typical @ RT | 5.81 V |
| | Process & temp. | 5.72 V < $V_{Rise}$ < 5.91 V<br>( -1.38% < $\Delta V/V_{Rise}$ < +1.90%) |
| Normalized accuracy across temp. ($V_{Rise}$) | Typical | +0.14% |
| | Process | +0.31%/-0.1% |
| Stand-alone | | Yes |

Figure 9

LOW POWER COMPARATOR

TECHNICAL FIELD

The present disclosure relates to a comparator and in particular to a low power comparator such as a stand-alone comparator that does not require using a bias circuit. The disclosure also relates to a comparator with high accuracy across temperature.

BACKGROUND

Comparators are used in many different electronic circuits for various types of applications. For instance comparators may be used as error comparators as part of a feedback loop. Comparators can also be used in a safety circuit to identify a particular condition. For instance, comparators are used in charger devices as part of a protection circuit to identify an under voltage or an over voltage. Conventional comparator circuits require a bias voltage and a bias current. A protection circuit based on conventional comparator circuits cannot operate on start up when the bias voltage and the bias current are not yet available.

It is an object of the disclosure to address one or more of the above mentioned limitations.

SUMMARY

According to a first aspect of the disclosure, there is provided a comparator comprising an input port for receiving an input voltage; an output port for providing an output voltage; a resistive divider having a first node for providing a first voltage and a second node for providing a second voltage; a first transistor having a control terminal coupled to the first node, a first terminal coupled to the input port, and a second terminal coupled to a common node; a second transistor having a control terminal coupled to the second node, a first terminal coupled to the input port, and a second terminal coupled to the common node; a differential amplifier having a first input coupled to the first terminal of the first transistor, a second input coupled to the first terminal of the second transistor and an output coupled to the output port.

Optionally, the first transistor is coupled to the input port via a third transistor, and the second transistor is coupled to the input port via a fourth transistor.

Optionally, the first transistor has a first threshold voltage and the second transistor has a second threshold voltage, and wherein the first threshold voltage is greater than the second threshold voltage.

Optionally, the first transistor is an anti doped gate transistor. For example the first transistor may be an n-type transistor having a p-doped gate terminal.

Optionally, the comparator has a temperature compensated threshold voltage.

Optionally, the first transistor has a first size and second transistors has a second size, and wherein a size ratio of the first size over the second size is selected to achieve the temperature compensated threshold voltage.

Optionally, the first and second transistors are n-type transistors. For instance the first and second transistors may be n-type metal-oxide semiconductor field-effect transistors n-MOSFETs.

Optionally, the third and fourth transistors are p-type transistors. For instance the third and fourth transistors may be p-type metal-oxide semiconductor field-effect transistors p-MOSFETs.

Optionally, the third and fourth transistors are diode-connected transistors. For instance the third and fourth transistors may have a gate to drain connection.

Optionally, the comparator comprises a hysteresis switch having a control terminal coupled to the output port.

According to a second aspect of the disclosure, there is provided an electronic device comprising a comparator according to the first aspect.

Optionally, the electronic device is a power supply, and wherein the comparator is implemented in a feedback loop of the power supply.

For instance the power supply may be a DC-DC converter such as a Buck, a Boost, or a Buck Boost converter. The comparator may be an error comparator.

Optionally, the electronic device is a charger comprising a supervisor circuit configured to identify at least one of an under voltage and an over voltage; wherein the supervisor circuit comprises one or more comparators according to the first aspect.

For instance the charger may be a power management integrated circuit.

According to a third aspect of the disclosure, there is provided a method of comparing voltages, the method comprising
  receiving an input voltage at an input port;
  dividing the input voltage with a resistive divider to provide a first voltage at a first node and a second voltage at a second node;
  providing a first transistor having a control terminal coupled to the first node, a first terminal coupled to the input port, and a second terminal coupled to a common node;
  providing a second transistor having a control terminal coupled to the second node, a first terminal coupled to the input port, and a second terminal coupled to the common node;
  providing a differential amplifier having a first input coupled to the first terminal of the first transistor, a second input coupled to the first terminal of the second transistor and
  generating a difference voltage using the differential amplifier.

Optionally, the method comprises converting the first voltage into a first current using the first transistor; and converting the second voltage into a second current using the second transistor.

Optionally, the method comprises generating a bias current by adding the first current and the second current.

Optionally, the method comprises generating a comparator threshold voltage based on a difference between the first voltage and the second voltage.

Optionally, the first transistor has a first size and second transistors has a second size, the method further comprising selecting a size ratio of the first size over the second size to obtain a temperature compensated comparator threshold voltage.

The options described with respect to the first aspect of the disclosure are also common to the second and third aspects of the disclosure.

DESCRIPTION OF THE DRAWINGS

The disclosure is described in further detail below by way of example and with reference to the accompanying drawings, in which:

FIG. 9 is a table listing some performance parameters of the circuit of FIG. 4A;

DESCRIPTION

Figure 1:
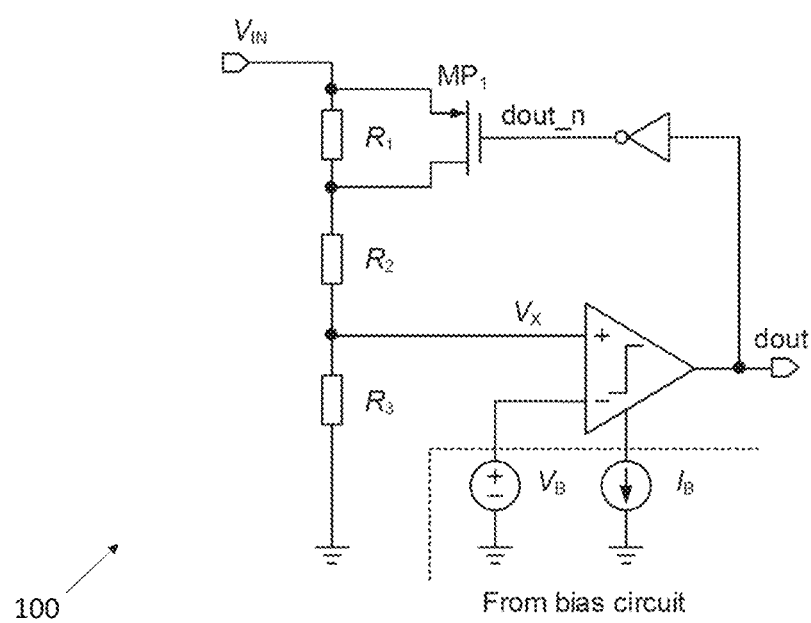
FIG. 1 is a diagram of a conventional comparator circuit.

FIG. 1 is a diagram of a conventional comparator circuit. The comparator circuit 100 includes a resistive ladder, a differential amplifier, a transistor MP1, and a bias circuit. The differential amplifier has a non-inverting input for receiving a voltage Vx from the resistive ladder, an inverting input for receiving a bias voltage VB from the bias circuit and an output providing a difference voltage to the gate of the transistor MP1 in a feedback loop.

Figure 2:
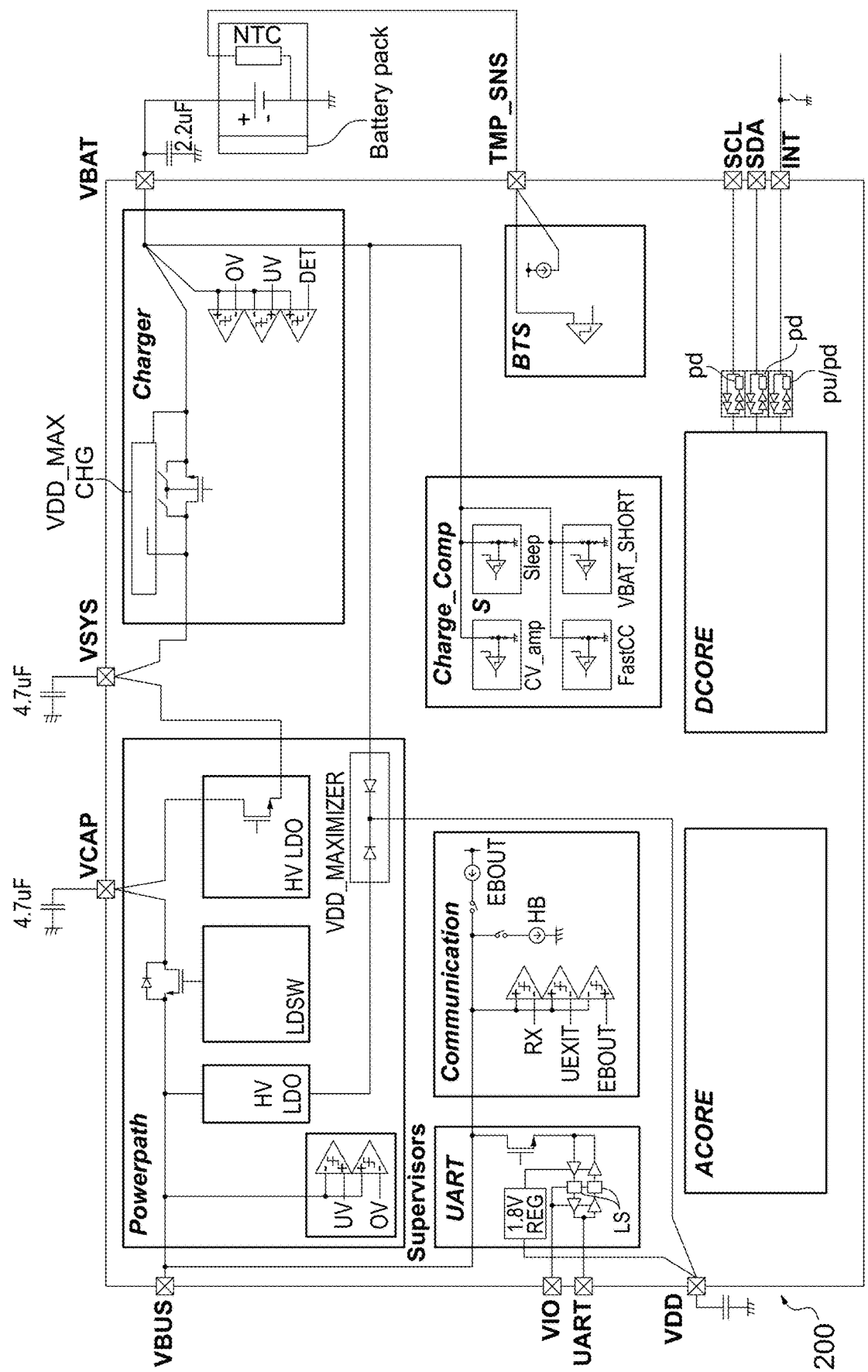
FIG. 2 is a schematic diagram of a charger.

FIG. 2 is a schematic diagram of a low power charger. The charger 200 has several ports including a VBUS port, a VCAP port, a VBAT port and a VDD port among others. Several circuits are provided including a power path circuit, a charger circuit, a VDD maximization circuit, an analog core circuit, ACORE, and a digital core circuit DCORE. The analog core circuit has bandgap, a bias current generator, and an oscillator. The digital core circuit is based on RTL logic.

In operation the charger 200 is driven by multiple power sources that include a battery and a USB power source. The VDD maximization circuit generates an internal supply voltage VDD by comparing the voltages from multiple sources and by selecting the highest voltage available which may include the voltage VBAT provided to the VBAT port, or external voltages such as VBUS from the VBUS port. The ACORE generates a bias voltage/current and a clock frequency and provides them to other circuits. The charger is protected by a supervisor circuit for handling faults such as an over voltage (OV) or an under voltage (UV). In this example the supervisor circuit has two comparators coupled to the VBUS port and powered by the internal power supply VDD selected by the VDD maximization circuit.

When the comparators of the supervisor circuit are implemented as in FIG. 1, a bias voltage and a bias current are required for operation. If there is no battery, the charger must wait to generate VDD from VBUS. Once VDD is supplied to ACORE, the analog core circuit starts to generate a bias voltage and current. The start-up of the system takes time, for instance a few hundred of microseconds for a low-power charger. During this time the charger cannot protect itself against the occurrence of an over voltage.

Figure 3:
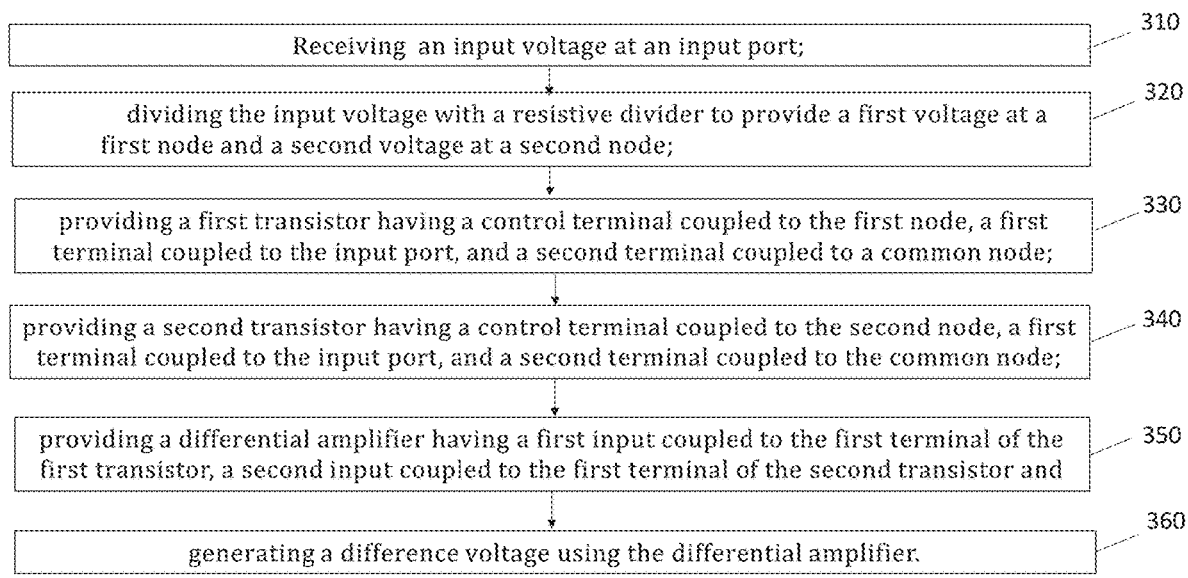
FIG. 3 is a flow diagram of a method for comparing a first voltage and a second voltage according to the disclosure.

FIG. 3 is a flow diagram of a method for comparing voltages according to the disclosure.

At step 310 an input voltage is received at an input port. At step 320 the input voltage is divided with a resistive divider to provide a first voltage at a first node and a second voltage at a second node. At step 330 a first transistor is provided. The first transistor has a control terminal coupled to the first node, a first terminal coupled to the input port, and a second terminal coupled to a common node. At step 340 a second transistor is provided. The second transistor has a control terminal coupled to the second node, a first terminal coupled to the input port, and a second terminal coupled to the common node. At step 350 a differential amplifier is provided. The differential amplifier has a first input coupled to the first terminal of the first transistor, a second input coupled to the first terminal of the second transistor. A step 360 a difference voltage is generated using the differential amplifier.

The first and second transistors may be selected such that the threshold voltage of the first transistor is greater than the threshold voltage of the second transistor.

The method may further include generating a comparator threshold voltage based on a difference between the first voltage and the second voltage. By selecting a size ratio of the size of the first transistor over the size of the second transistor the comparator threshold voltage may be temperature compensated.

Figure 4A:
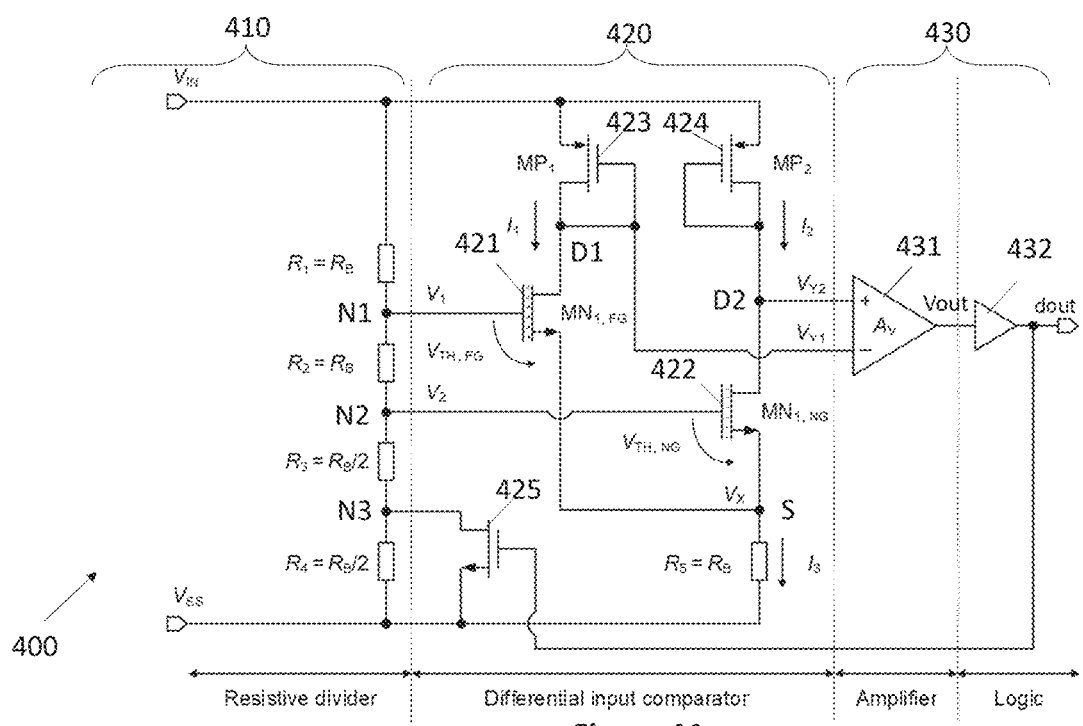
FIG. 4A is a diagram of a comparator circuit according to the disclosure.

FIG. 4A is a diagram of a comparator circuit according to the disclosure. The comparator 400 has an input port for receiving an input voltage Vin, a ground port, and an output port for providing an output voltage dout. The topology of the comparator can be divided into three stages: an input stage 410, a comparator stage 420, and an output stage 430.

The input stage 410 is formed of a resistive divider having a first node N1 for providing a first voltage V1 and a second node N2 for providing a second voltage V2. The resistive divider 410 has four resistances R1-R4 connected in series between the input port and ground. The resistances R1 and R2 may be equal to a bias resistance $R_B$, also referred to as unit resistor, while the resistances R3 and R4 may be equal to $R_B/2$.

The comparator stage 420 includes a first transistor 421 and a second transistor 422. The first transistor 421 has a control terminal coupled to the first node N1, a first terminal coupled to the input port, and a second terminal coupled to a common node S. Similarly the second transistor 422 has a control terminal coupled to the second node N2, a first terminal coupled to the input port, and a second terminal coupled to the common node S. The node S is coupled to ground via a fifth resistance R5. R5 may be equal to $R_B$.

The first and second transistors 421, 422 are coupled to the input port via a third and a fourth transistor 423, 424, respectively. The transistors 423 and 424 may be implemented as P-type transistors. In this example the transistors 423 and 424 are diode-connected transistors that is having the gate terminal connected to the drain terminal. As a result the transistors 423 and 424 operate in the saturation region.

The gate of the transistor 423 has a voltage VD1=VY1 and the gate of transistor 424 has a voltage VD2=VY2.

The output stage 430 includes a differential amplifier 431 having a first input, for instance an inverting input coupled to the first terminal of the first transistor 421 at node D1, a second input, for instance a non-inverting input, coupled to the first terminal of the second switch 422 at node D2 and an output coupled to the output port via a buffer 432. The buffer 432 is optional. If the buffer has a gain of one, then the output voltage at the output of 431 is equal to the output dout of the buffer 432 such that Vout=dout.

Optionally, a fifth transistor also referred to as hysteresis switch 425 may be provided to perform hysteresis. In this example the switch 425 has a control terminal coupled to the output port, a first terminal coupled to node N3 of the resistive divider, and a second terminal coupled to ground.

In this example the transistors 421, 422, and 425 are implemented as N-type transistors for which the control terminal is a gate terminal, the first terminal is a drain terminal, and the second terminal is a source terminal. The first transistor 421 is a so-called flipped gate (FG) transistor having a threshold voltage VTH_FG. The second transistor 422 is a so-called normal gate transistor (NG) having a threshold voltage VTH_NG. For instance 421 may be a flipped gate 5-V nMOS transistor, and 422 may be a 5-V nMOS transistor.

The transistor size ratio k of the size of the first transistor 421 (FG) over the size of the second transistor 422 (NG), may be chosen to compensate the temperature dependence of the threshold voltage VTH_FG. It is similar to the operation principle of a floating bandgap voltage reference.

The threshold voltage VTH_FG of transistor 421 is greater than the threshold voltage VTH_NG of transistor 422. For instance, VTH_FG may be twice the VTH_NG. In an exemplary numerical example VTH_FG=1.8V and VTH_NG=0.9V.

To provide a threshold voltage of the transistor 421 that is greater than the threshold voltage of the transistor 422, the transistor 421 may be implemented as an anti-doped-gate transistor also referred to as a flipped gate transistor. A transistor is an anti-doped-gate transistor when its gate is doped with a doping type opposite to that of the transistor type. For example, an n-type transistor will be an anti-doped-gate transistor if it has a p-doped gate.

In the present embodiment, the transistor 421 is an anti-doped-gate n-type transistor, and as such it has a p-doped gate. The transistor 422 is an n-type transistor with an n-doped gate, and may be referred to as a normal gate transistor. The different doping of the gates for the first transistor 421 and the second transistor 422 results in the anti-doped-gate transistor 421 having a greater threshold voltage than that of the transistor 422.

Figure 4B:
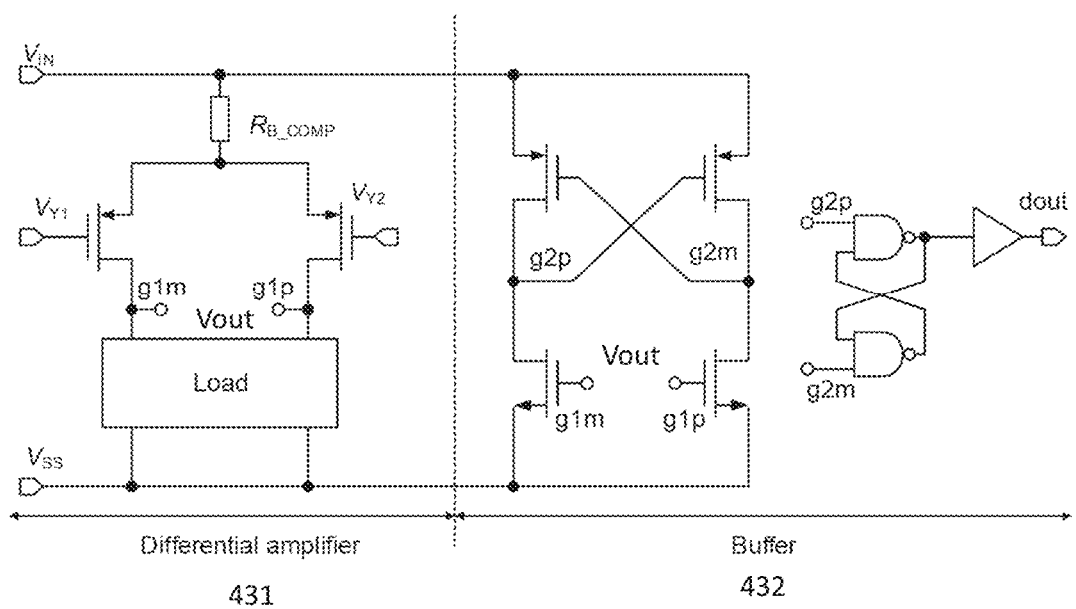
FIG. 4B is a diagram of an exemplary differential amplifier and an exemplary buffer for use in the comparator circuit of FIG. 4A.

FIG. 4B is a diagram of an exemplary implementation of a differential amplifier and a buffer for use in the comparator of FIG. 4A. The differential amplifier 431 includes a pair of transistors for receiving the voltages VY1 and VY2, respectively. Each transistor is coupled to the input port vis a bias resistance RB_COMP=RB. The differential amplifier 431 does not need a bias current circuit. The output Vout of the differential amplifier 431 can be expressed as Vout=A*(VY2-VY1) in which A is the gain of the differential amplifier.

Figure 4C:
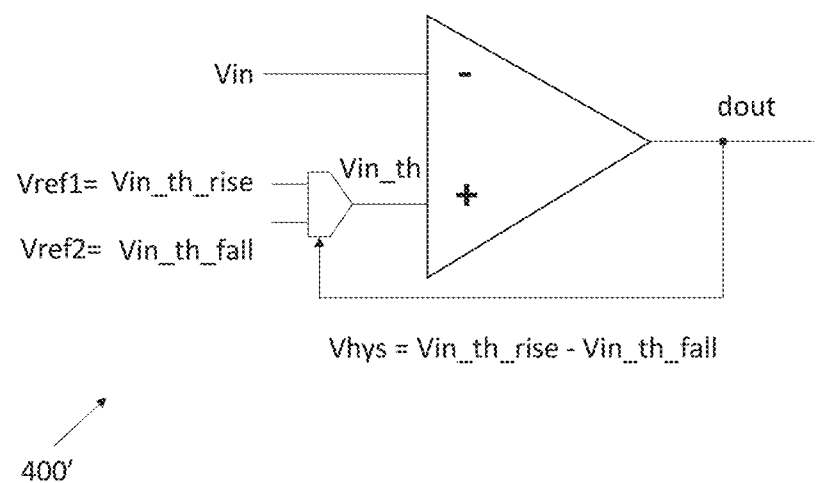
FIG. 4C is an equivalent diagram of the comparator of FIG. 4A.

FIG. 4C is an equivalent diagram of the comparator of FIG. 4A. The equivalent comparator 400' has an inverting input for receiving the input voltage Vin, a non-inverting input for receiving a reference voltage also referred to as threshold voltage Vin_th, and an output for providing the output dout. When the hysteresis loop is implemented, a multiplexer is provided at the non-inverting input for selecting one of Vref 1=Vin_th_rise or Vref 2=Vin_th_fall. The multiplexer is coupled to the output of the comparator to receive a feedback or selection signal Vhys.

The signal Vhys=Vin_th_rise−Vin_th_fall. When the output dout is low, Vin_th_rise is selected, and the comparator compares Vin with Vin_th_rise. As a result, dout goes from low to high when Vin reaches Vin_th_rise. On the other hand, when the dout is high, Vin_th_low is selected, and the comparator compares Vin with Vin_th_fall. Thus, dout goes from high to low when Vin reaches Vin_th_fall.

Figure 5:
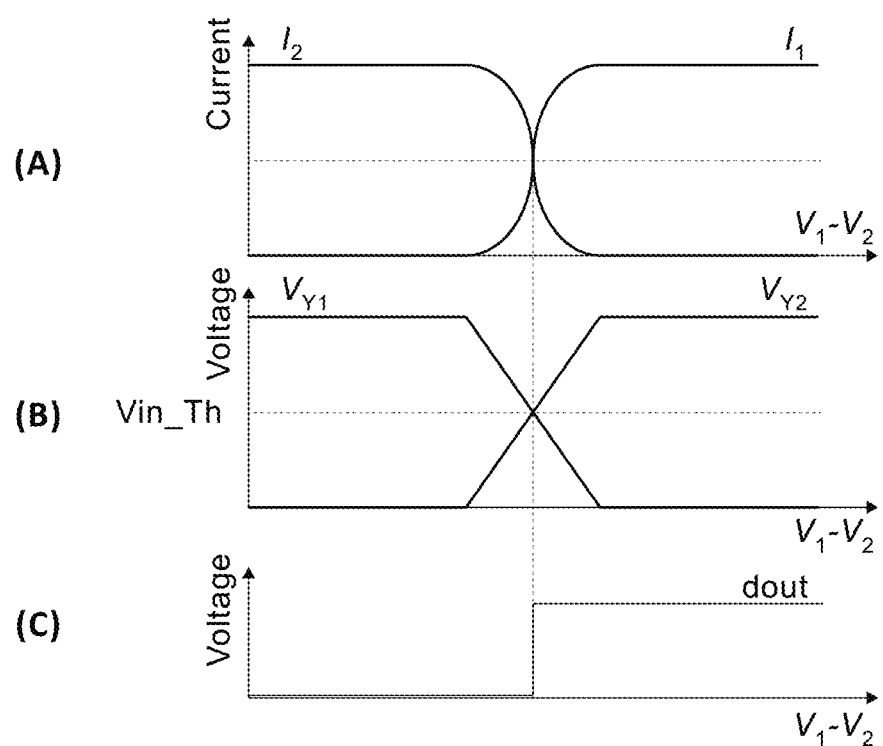
FIG. 5 is a plot illustrating the operation of the comparator of FIG. 4A.

FIG. 5 is a waveform plot illustrating the operation of the comparator of FIG. 4. FIG. 5A shows the currents I1 and I2 as a function of the difference voltage V1-V2. FIG. 5B shows the drain voltages VY1 and VY2 as a function of the difference voltage V1-V2. FIG. 5C shows the output voltage dout as a function of the difference voltage V1-V2.

In operation the resistive divider (input stage 410) generates the voltages V1 and V2 by dividing the input voltage Vin. The comparator stage 420 receives V1 and V2 and converts them into the current I1, and I2 respectively. The first transistor 421 receives V1 at its gate and the current I1 flows through transistors 421 and 423. Similarly, the second transistor 422 receives V2 at its gate and the current I2 flows through transistors 424 and 422.

The current I3 through R5, also referred to internal bias current, is equal to the sum of the currents I1 and I2. The current I3=Vx/R5, in which Vx is the voltage at the common node S. The value of the resistance R5 may be chosen depending on the bias current that is required. The greater R5 the lower the bias current I3, hence the lower the quiescent current Iq.

The quiescent current Iq can be expressed as the sum of I3+Ires_div (current through the resistive divider)+Iq_diff (quiescent current of the differential amplifier), in which Ires_div=VIN/(R1+R2+R3), and Iq_diff=(Vin−Vx)/$R_{B\_COMP}$.

However as R5 increases the transient response of the circuit becomes slower. So there is a trade-off between the speed of the transient response and how low it the quiescent current. The drain voltages VY1 at node D1 and VY2 at node D2 are determined by the currents I1 and I2, respectively.

As shown in FIG. 5A, the current I1 increases as V1-V2 increases, while I2 decreases as V1-V2 increases. When I1 reaches I2, the comparator 400 detects it. The differential amplifier 431 amplifies the voltage difference between VY1 and VY2, to generate the output voltage Vout and the logic output dout via buffer 432. The logic output dout goes from low to high when I1=I2 and VY1=VY2 also referred to as the trip point.

The difference voltage V1-V2 can be expressed by Eq. (1) for the rising case as follows:

$$V1 - V2 = (R2/(R1 + R2 + R3 + R4)) * VIN \quad (1)$$

Considering the currents I1, and I2, the difference voltage V1-V2 can be expressed as a function of the threshold voltages VTH_FG and VTH_NG by Eq. (2) as follows:

$$V1 - V2 = VTH\_FG - VTH\_NG - \eta VT \ln(k\ I1/I2) = VBG \quad (2)$$

in which n is the sub-threshold slope factor, VT is the thermal voltage, k is the transistor size ratio FG/NG, and VBG is a semiconductor bandgap voltage, for instance the bandgap voltage of silicon for silicon based transistors.

Therefore, by choosing the appropriate transistor size ratio k, the difference voltage V1-V2 becomes temperature compensated VBG. Equation (2) is true for both the rising and the falling case.

The temperature coefficient of the threshold voltage Vin_Th is compensated by setting the appropriate transistor ratio k. So Vin_Th remains substantially constant with temperature variations.

From Equations (1) and (2), the threshold voltage of the comparator circuit VIN_TH can be expressed by Eq. (3) as follows:

$$V_{IN\_TH} = ((R1 + R2 + R3 + R4)/R2) * VBG \quad (3)$$

For completeness it is noted that Vin_th_rise=((R1+R2+R3+R4)/R2)*VBG and Vin_th_fall=((R1+R2+R3)/R2)*VBG.

The threshold voltage VIN_TH of the comparator can be programmed or adjusted by changing resistor ratio to achieve the desired threshold voltage. In turn the comparator circuit 400 can detect the desired threshold voltage without the need for a bias circuit.

The comparator 400 can be used to compare an input voltage Vin with a reference voltage (here described as the threshold voltage Vin_Th) without the need for a separate bandgap circuit.

It will be appreciated that the comparator circuit 400 may be used in different applications, for instance as part of a supervisor circuit for a power management integrated circuit (PMIC) as shown in FIG. 2, or as an error comparator as part of a feedback loop of a DC-DC converter, among others.

The response time of the comparator 400 is determined by the resistances R1-R5 and the bias resistor $R_B = R_{B\_comp}$ provided in the differential amplifier 431 (See FIG. 4B). By reducing the resistance value of each resistor, the response time of the comparator gets faster. The comparator 400 can therefore by used as an error comparator in a DC-DC converter.

As explained above the comparator circuit 400 can accurately detect monitoring voltage without a bias current and a bias voltage. It can therefore be employed as a general purpose comparator for various PMIC such as main PMIC and sub-PMIC. This enables the PMIC to have a flexible power sequence, and accurate under and over voltage identification. The comparator circuit 400 could also be used as part of power on reset (POR) circuit.

In addition, since the circuit 400 can operate without bias current and voltage, it is possible to perform circuit testing it in parallel, hence reducing test time and production cost.

Figure 6A:
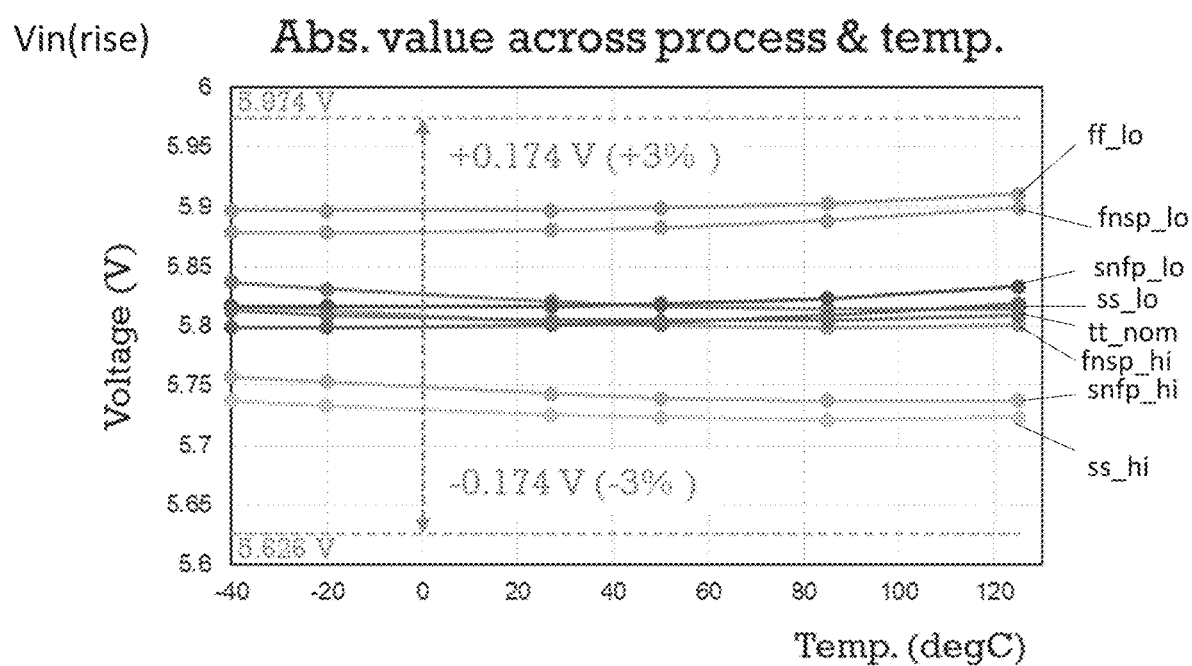
FIG. 6A is a DC simulation of the operation of the comparator of FIG. 4A, as a function of temperature and obtained for different processes corners.
Figure 6B:
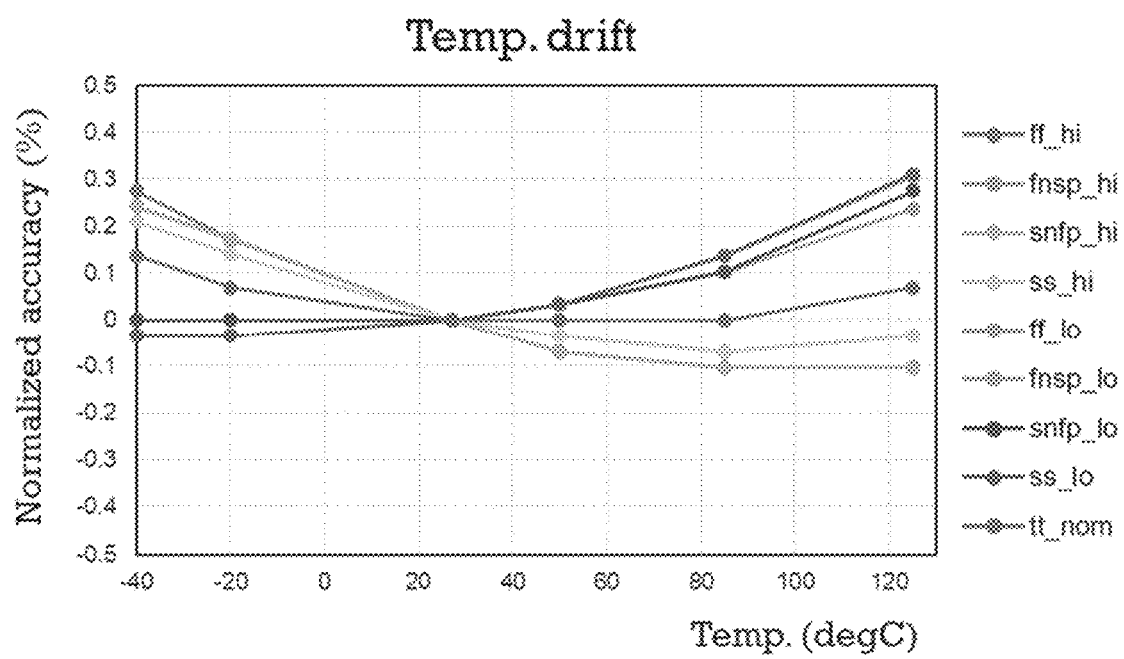
FIG. 6B shows the normalised simulated input voltages of FIG. 6A.

FIG. 6A is a DC simulation of the operation of the comparator of FIG. 4A as a function of temperature and obtained for different processes corners. In this DC simulation the voltage Vin is swept from 5.4V to 6.1V with 2 mV step when dout goes from low to high, hence simulating the proposed comparator using Vin. FIG. 6B shows the normalised simulated voltages of FIG. 6A. In this example the circuit was implemented using 130-nm CMOS BCD process. The rise and fall voltages Vin_th_rise and Vin_th_fall were set to 5.8 V and 5.6 V respectively. The simulation was performed using the Simulation Program with Integrated Circuit Emphasis (SPICE).

Nine front end of line (FEOL) process corners are presented: fast-fast labelled ff_hi, ff_lo; fast-slow labelled fnsp_hi, fnsp_lo; slow-slow labelled ss_hi, ss_lo; slow-fast labelled snfp_hi, snfp_lo, and typical-typical labelled tt_nom. By convention the first letter refers to the N-channel MOSFET (NMOS) corner, and the second letter refers to the P channel (PMOS) corner. For example, a corner designated as FS or fnsp denotes fast NFETs and slow PFETs. FIG. 6A shows that the absolute value of $V_{RISE}$ has an accuracy of +1.90%/−1.38% without trimming. FIG. 6B shows that the normalised value of $V_{RISE}$ has an accuracy of +0.31%/−0.1% across different processes.

Figure 7A:
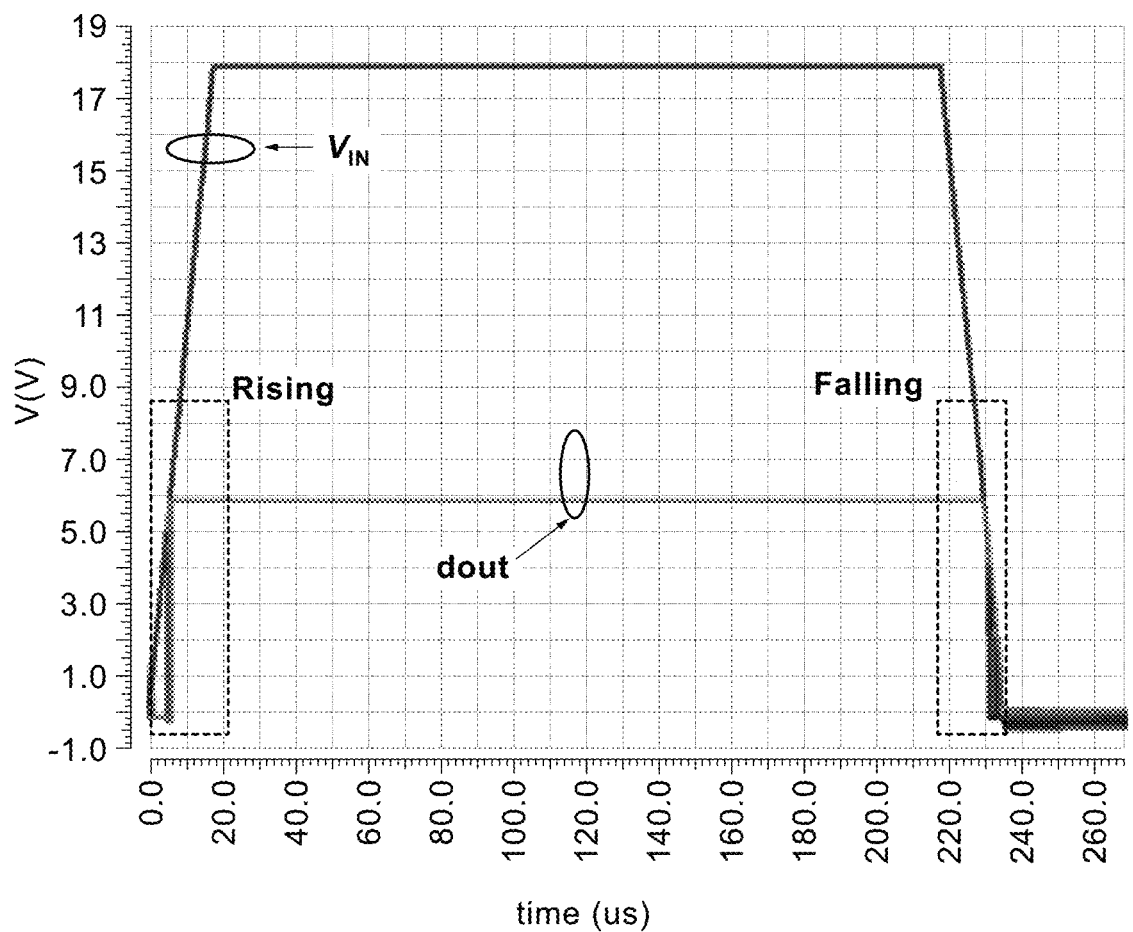
FIG. 7A is a transient simulation of the logic output dout obtained with an input voltage having a slope of 1 V/µs.
Figure 7B:
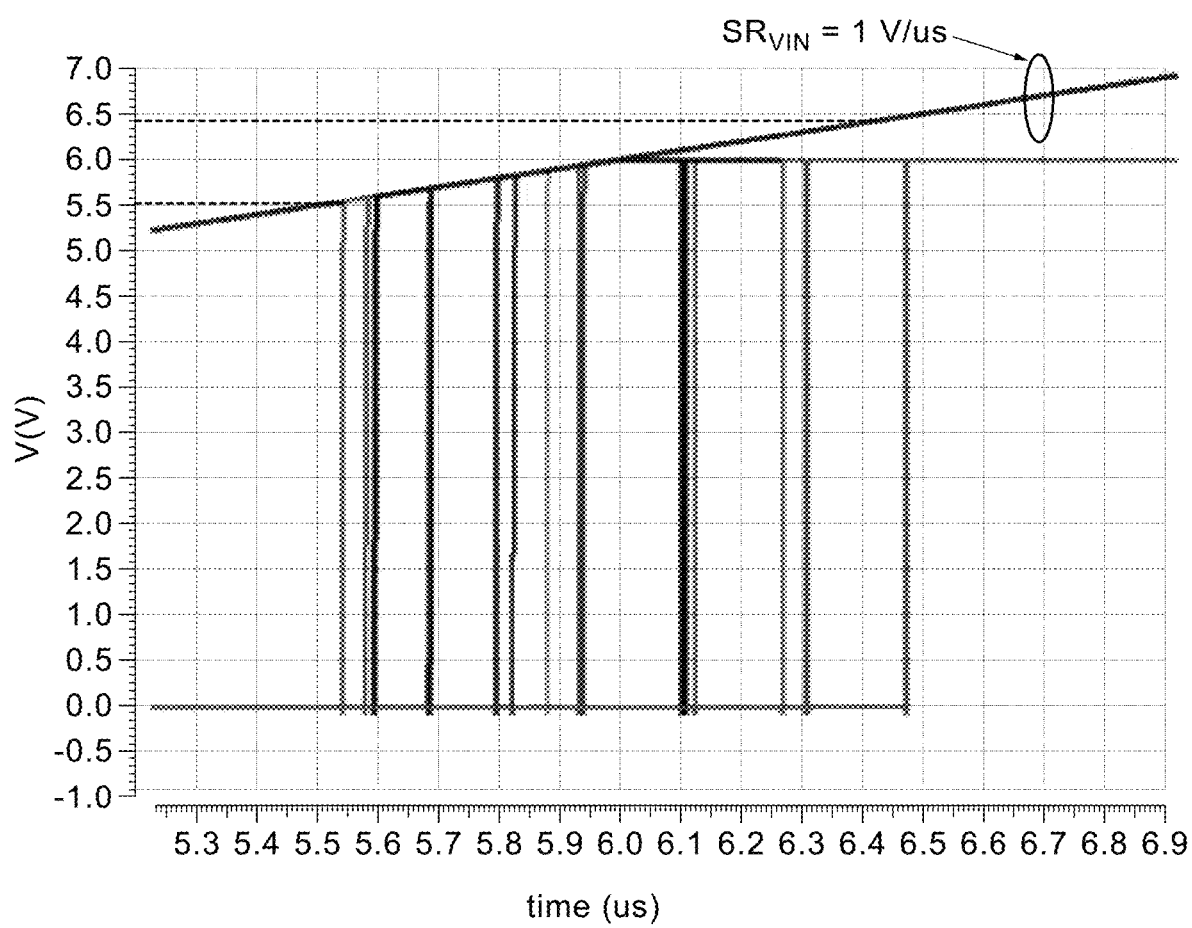
FIG. 7B is a closeup of the transient simulation of FIG. 7A during rise of Vin.
Figure 7C:
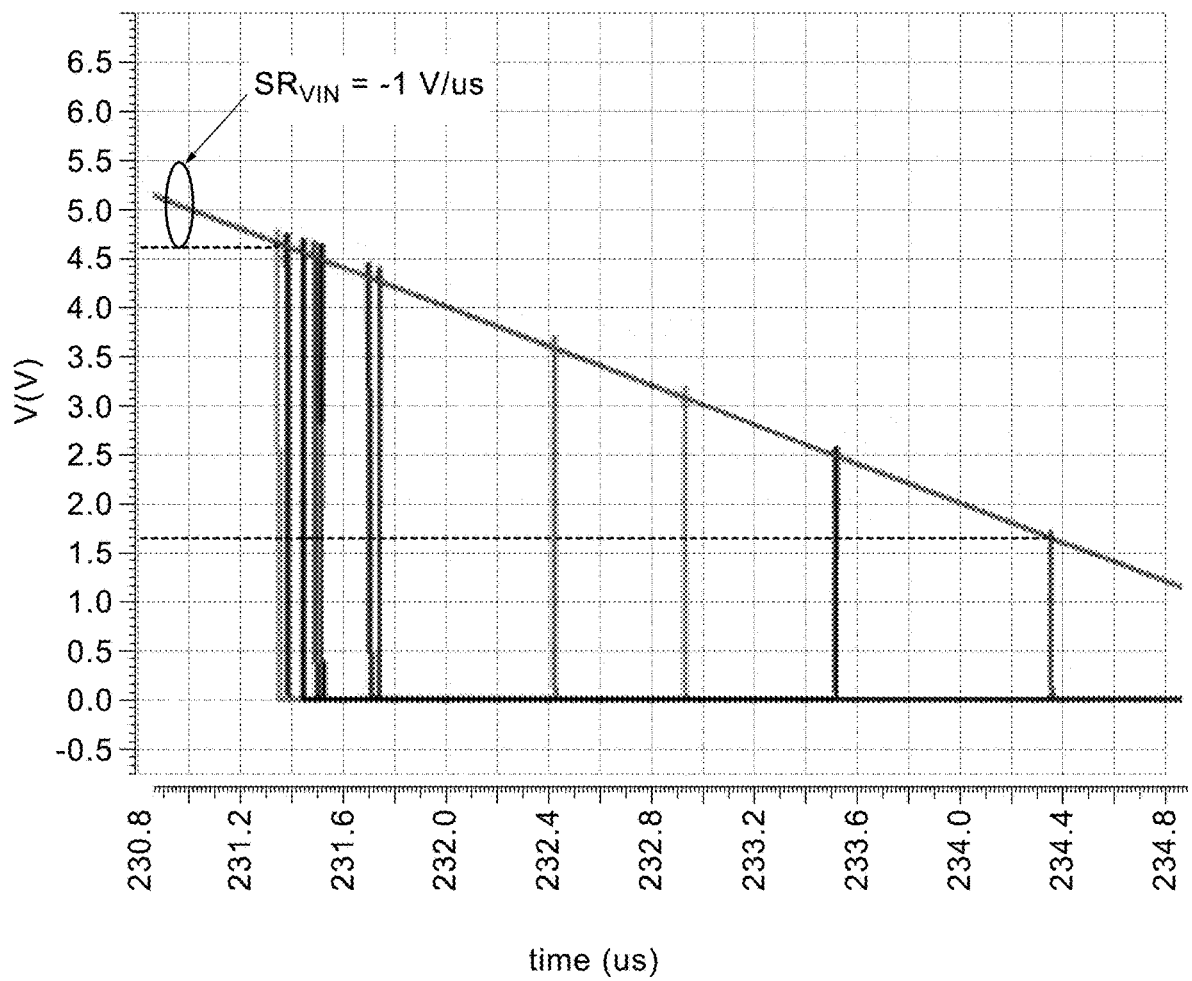
FIG. 7C is a closeup of the transient simulation of FIG. 7A during fall of Vin.

FIG. 7A is a transient simulation of the logic output dout obtained with an input voltage Vin having a slope of 1 V/µs. FIG. 7B is a closeup of the transient simulation of FIG. 7A during rise of Vin. FIG. 7C is a closeup of the transient simulation of FIG. 7A during fall of Vin. The different lines shown in FIGS. 7B and 7C corresponding to different process corners.

Figure 8A:
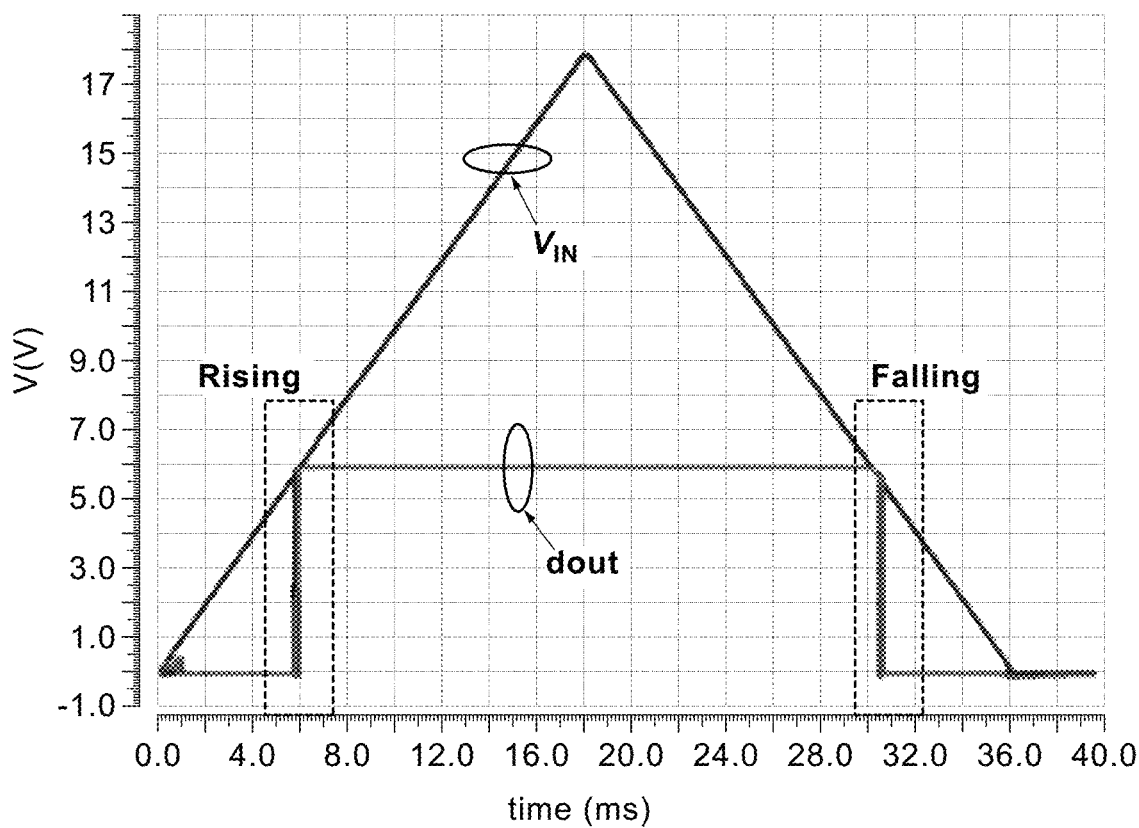
FIG. 8A is a transient simulation of the logic output dout obtained with an input voltage having a slope of 1 V/ms.
Figure 8B:
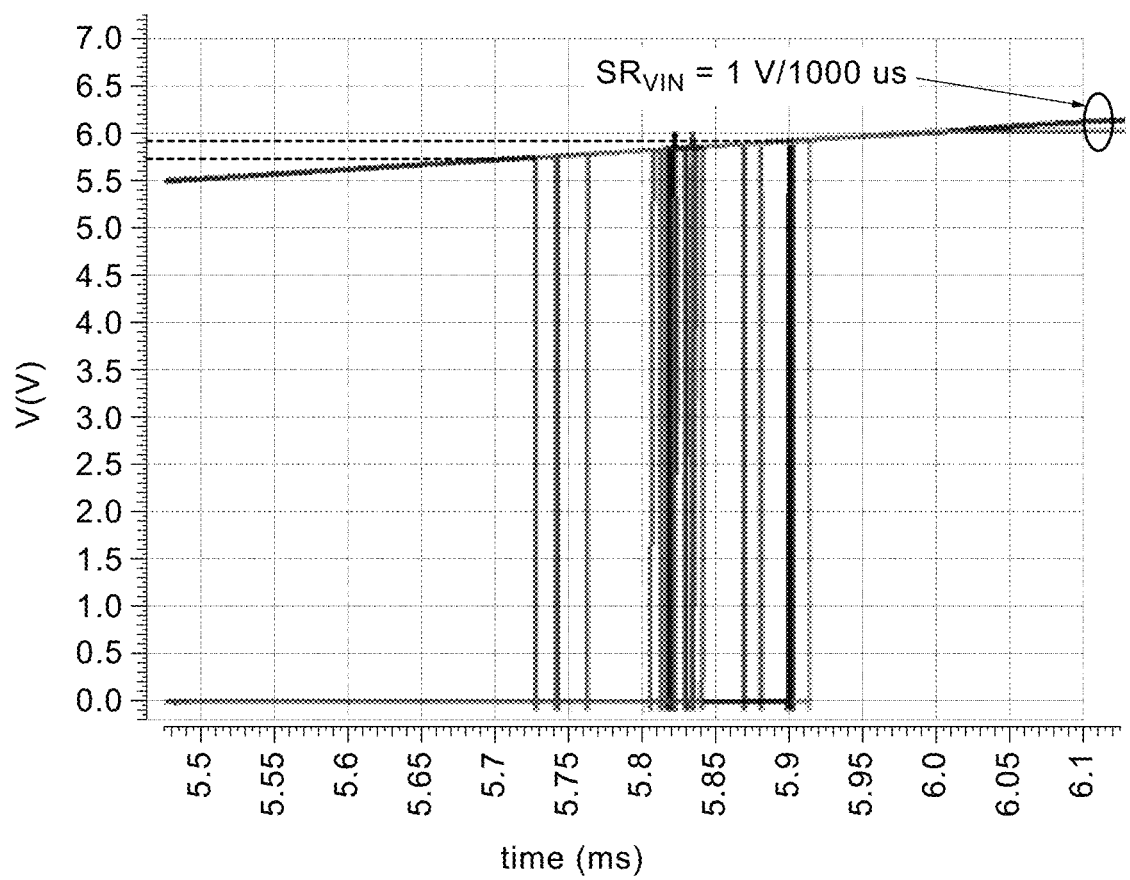
FIG. 8B is a closeup of the transient simulation of FIG. 8A during rise of Vin.
Figure 8C:
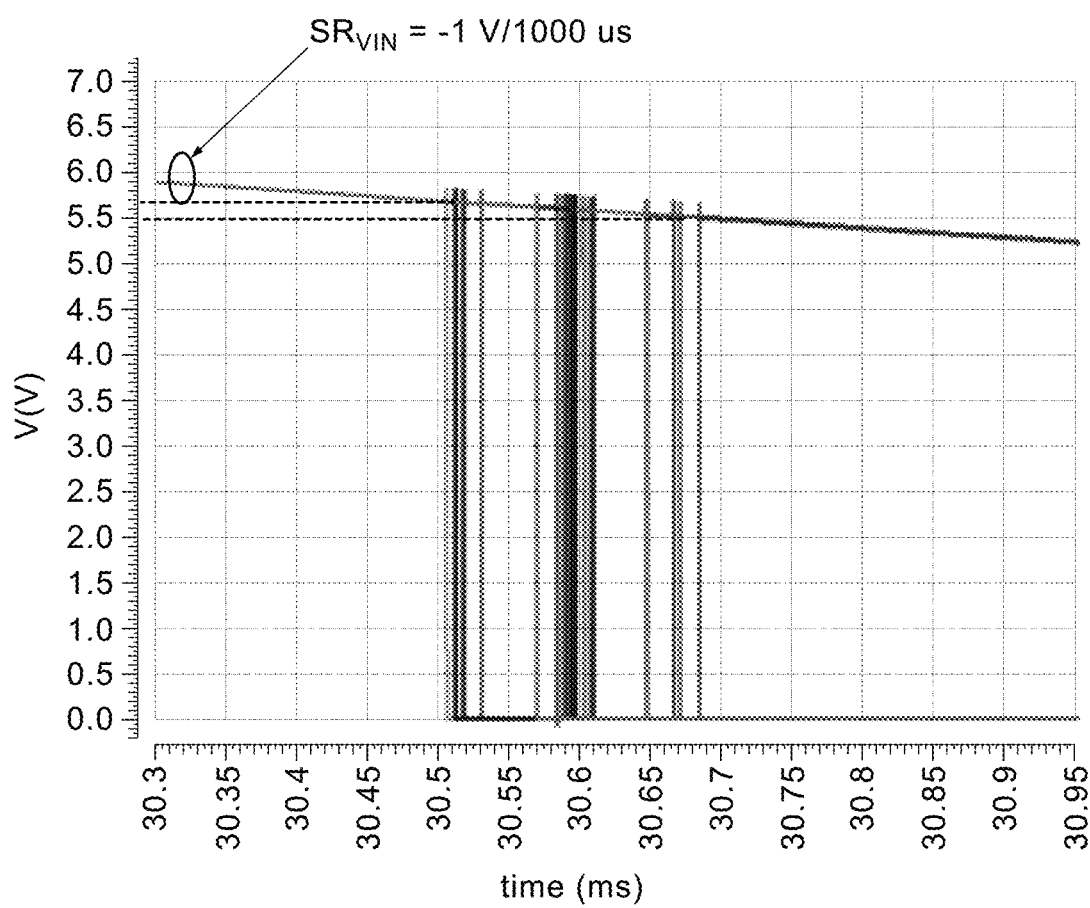
FIG. 8C is a closeup of the transient simulation of FIG. 8A during fall of Vin.

FIG. 8A is a transient simulation of the logic output dout obtained with an input voltage Vin having a slope of 1 V/ms. FIG. 8B is a closeup of the transient simulation of FIG. 7A during rise of Vin. FIG. 8C is a closeup of the transient simulation of FIG. 7A during fall of Vin.

In the simulations of FIGS. 7 and 8, the logic output dout is regulated to 6V. The target threshold voltage Vin_th_rise was set to 5.8 V. It is noted that this value is for simulation purpose and does not affect performance of the circuit. As shown in FIG. 7, although detected values were slightly higher than DC simulation due to fast slope, the proposed circuit can operate without bias circuit. As shown in FIG. 8, detected threshold voltages were same as DC simulation.

FIG. 9 is a table showing a performance summary of the circuit 400. The circuit 400 can operate with a low quiescent current (low-Iq) and high accuracy. This is achieved without a bias circuit.

Figure 10:
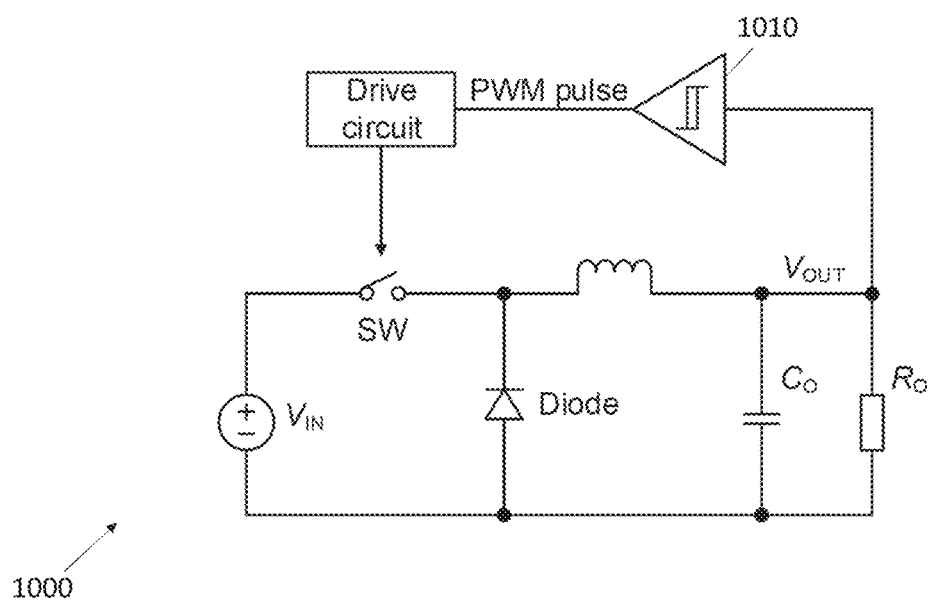
FIG. 10 is a diagram of a DC-DC converter provided with a comparator according to the disclosure.

FIG. 10 is a diagram of a DC-DC converter provided with a comparator according to the disclosure. In this example an error comparator 1010 is provided in a feedback loop for driving the DC-DC converter 1000. The error comparator 1010 receives the output voltage Vout of the DC-DC converter and provides a pulse width modulated signal PWM to a driver circuit for driving a power switch SW of the DC-DC converter. The comparator 1010 may be implemented as the comparator 400 of FIG. 4A.

The proposed comparator circuit has a temperature compensated threshold voltage which can be adjusted to a desired value. It can also operate as stand-alone without bias current and bias voltage. The comparator of the disclosure can also achieve ultra-low quiescent current operation. The comparator of the disclosure can be used in various circuits including but not limited to any battery charger or PMIC that requires high accuracy, self-bias, and low Iq comparators. The comparator can be manufactured using different process technologies.

A skilled person will appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

The invention claimed is:
1. A comparator comprising:
   an input port for receiving an input voltage;
   an output port for providing an output voltage;

a resistive divider having a first node for providing a first voltage and a second node for providing a second voltage;

a first transistor having a control terminal coupled to the first node, a first terminal coupled to the input port, and a second terminal coupled to a common node;

a second transistor having a control terminal coupled to the second node, a first terminal coupled to the input port, and a second terminal coupled to the common node; and a differential amplifier having a first input coupled to the first terminal of the first transistor, a second input coupled to the first terminal of the second transistor and an output coupled to the output port, wherein the first transistor is coupled to the input port via a third transistor, and wherein the second transistor is coupled to the input port via a fourth transistor, wherein the third transistor has a control terminal coupled to the first input of the differential amplifier, and wherein the fourth transistor has a control terminal coupled to the second input of the differential amplifier, and wherein the first transistor is an anti-doped gate transistor in which the gate of the first transistor is doped with a doping type opposite to that of the first transistor type, and wherein the second transistor is a normal gate transistor in which the gate of the second transistor is doped with a same doping type as the second transistor type.

2. The comparator as claimed in claim 1,
wherein the first transistor has a first threshold voltage and the second transistor has a second threshold voltage, and
wherein the first threshold voltage is greater than the second threshold voltage.

3. The comparator as claimed in claim 1,
wherein the comparator has a temperature compensated threshold voltage.

4. The comparator as claimed in claim 3,
wherein the first transistor has a first size and the second transistor has a second size, and
wherein a size ratio of the first size over the second size is selected to achieve the temperature compensated threshold voltage.

5. The comparator as claimed in claim 1,
wherein the first and second transistors are n-type transistors.

6. The comparator as claimed in claim 1,
wherein the third and fourth transistors are p-type transistors.

7. The comparator as claimed in claim 1,
wherein the third and fourth transistors are diode-connected transistors.

8. The comparator as claimed in claim 1, comprising a hysteresis switch having a control terminal coupled to the output port.

9. An electronic device comprising the comparator as claimed in claim 1.

10. The electronic device as claimed in claim 9,
wherein the electronic device is a power supply, and
wherein the comparator is implemented in a feedback loop of the power supply.

11. The electronic device as claimed in claim 9,
wherein the electronic device is a charger comprising a supervisor circuit configured to identify at least one of an under voltage and an over voltage, and
wherein the supervisor circuit comprises one or more of the comparator.

12. A method of comparing voltages, the method comprising
receiving an input voltage at an input port;
dividing the input voltage with a resistive divider to provide a first voltage at a first node and a second voltage at a second node;
providing a first transistor having a control terminal coupled to the first node, a first terminal coupled to the input port, and a second terminal coupled to a common node;
providing a second transistor having a control terminal coupled to the second node, a first terminal coupled to the input port, and a second terminal coupled to the common node;
providing a differential amplifier having a first input coupled to the first terminal of the first transistor, a second input coupled to the first terminal of the second transistor; and
generating a difference voltage using the differential amplifier,
wherein the first transistor is coupled to the input port via a third transistor, and wherein the second transistor is coupled to the input port via a fourth transistor,
wherein the third transistor has a control terminal coupled to the first input of the differential amplifier, and wherein the fourth transistor has a control terminal coupled to the second input of the differential amplifier, and
wherein the first transistor is an anti-doped gate transistor in which the gate of the first transistor is doped with a doping type opposite to that of the first transistor type, and wherein the second transistor is a normal gate transistor in which the gate of the second transistor is doped with a same doping type as the second transistor type.

13. The method as claimed in claim 12, comprising
converting the first voltage into a first current using the first transistor; and
converting the second voltage into a second current using the second transistor.

14. The method as claimed in claim 13, comprising generating a bias current by adding the first current and the second current.

15. The method as claimed in claim 12, comprising generating a comparator threshold voltage based on a difference between the first voltage and the second voltage.

16. The method as claimed in claim 12, wherein the first transistor has a first size and second transistors has a second size, the method further comprising selecting a size ratio of the first size over the second size to obtain a temperature compensated comparator threshold voltage.

* * * * *